(12) United States Patent
Omstead et al.

(10) Patent No.: US 6,508,197 B1
(45) Date of Patent: Jan. 21, 2003

(54) APPARATUS FOR DISPENSING GAS FOR FABRICATING SUBSTRATES

(75) Inventors: Thomas R. Omstead, Austin, TX (US); Panya Wongsenakhum, Austin, TX (US); William J. Messner, Mt. Morris, NY (US); Edward J. Nagy, Cypress Mill, TX (US); William Starks, Victor, NY (US); Mehrdad M. Moslehi, Los Altos, CA (US)

(73) Assignee: CVC Products, Inc., Rochester, NY (US)

( * ) Notice: Subject to any disclaimer, the term of this patent is extended or adjusted under 35 U.S.C. 154(b) by 0 days.

(21) Appl. No.: 09/484,816

(22) Filed: Jan. 18, 2000

Related U.S. Application Data

(62) Division of application No. 09/146,486, filed on Sep. 3, 1998, now Pat. No. 6,190,732.

(51) Int. Cl.7 ............................. C23C 16/00; C23F 1/00
(52) U.S. Cl. ................................. 118/715; 156/345.34
(58) Field of Search ..................... 118/715; 156/345.33, 156/345.34

(56) References Cited

U.S. PATENT DOCUMENTS

| | | | |
|---|---|---|---|
| 3,705,769 A | 12/1972 | Johannsmeier | 355/91 |
| 4,469,556 A * | 9/1984 | Sanford | 162/380 |
| 4,792,378 A | 12/1988 | Rose et al. | 156/643 |
| 4,825,809 A | 5/1989 | Mieno | 118/725 |
| 4,948,623 A | 8/1990 | Beach et al. | 427/35 |
| 4,970,093 A | 11/1990 | Sievers et al. | 427/38 |
| 5,000,113 A | 3/1991 | Wang et al. | 118/723 |
| 5,082,542 A | 1/1992 | Moslehi et al. | 204/192.32 |
| 5,085,731 A | 2/1992 | Norman et al. | 156/646 |
| 5,098,516 A | 3/1992 | Norman et al. | 156/666 |
| 5,112,448 A | 5/1992 | Chakravorty | 205/118 |
| 5,156,820 A | 10/1992 | Wong et al. | 422/186.05 |

(List continued on next page.)

FOREIGN PATENT DOCUMENTS

| | | | |
|---|---|---|---|
| EP | 0 093 971 A2 | 4/1983 | H01L/29/40 |
| EP | 0 297 348 | 1/1989 | C23C/16/18 |
| EP | 0 698 918 A1 | 2/1996 | H01L/21/3205 |
| EP | 0 725 439 A2 | 8/1996 | H01L/23/532 |
| EP | 0 881 673 A2 | 12/1998 | H01L/21/768 |
| JP | 63-38581 | * 2/1988 | |
| JP | 355016455 A | 2/1990 | H01L/21/68 |
| JP | 3-170675 | * 7/1991 | |
| WO | WO 99/27152 | 6/1999 | C23C/16/00 |

OTHER PUBLICATIONS

Cardoso, et al., "Improvements in Wafer Temperature Measurements"; American Vacuum Society, J.Vac. Sci. Technol. B 19(2), pp. 397–402, Mar./Apr. 2001.

(List continued on next page.)

Primary Examiner—Jeffrie R. Lund
(74) Attorney, Agent, or Firm—Baker Botts L.L.P.

(57) ABSTRACT

A method and system for fabricating a device on a substrate with a process gas, such as with chemical vapor deposition. A reaction chamber and support chuck cooperate to form a low conductance configuration for axisymetric process gas flow over the substrate and to form a high conductance configuration for enhanced evacuation of residual process gas from the reaction chamber upon completion of the process. A dual conductance chuck has an indented region that aligns with the exhaust port of the reaction chamber to restrict process gas flow in the low conductance configuration, and that moves distal a showerhead and the exhaust port to provide reduced restriction of process gas flow for reaction chamber evacuation. The chuck includes thermal control for enhancing film deposition on the substrate and for reducing residual film deposition on the chuck. An evacuation opening in the housing provides independent evacuation of residual gas from the housing. The present invention enhance throughput of device formation by reducing purge and process cycle times.

23 Claims, 9 Drawing Sheets

U.S. PATENT DOCUMENTS

| | | | |
|---|---|---|---|
| 5,231,751 A | 8/1993 | Sachdev et al. | 29/852 |
| 5,268,034 A | 12/1993 | Vukelic | 118/719 |
| 5,294,778 A | 3/1994 | Carman et al. | 219/385 |
| 5,312,509 A | 5/1994 | Eschbach | 156/345 |
| 5,312,792 A | 5/1994 | Roberie | 502/60 |
| 5,354,712 A | 10/1994 | Ho et al. | 437/195 |
| 5,453,124 A | 9/1995 | Moshehi et al. | 118/715 |
| 5,464,656 A | 11/1995 | Verkade | 427/248.1 |
| 5,547,539 A | 8/1996 | Arasawa et al. | 156/626.1 |
| 5,554,226 A * | 9/1996 | Okase et al. | 118/724 |
| 5,595,606 A * | 1/1997 | Fujikawa et al. | 118/725 |
| 5,624,498 A | 4/1997 | Lee et al. | 118/715 |
| 5,674,787 A | 10/1997 | Zhao et al. | 437/230 |
| 5,695,568 A | 12/1997 | Sinha et al. | 118/729 |
| 5,708,556 A | 1/1998 | van Os et al. | 361/234 |
| 5,723,028 A | 3/1998 | Poris | 204/231 |
| 5,730,801 A | 3/1998 | Tepman et al. | 118/719 |
| 5,736,191 A | 4/1998 | Biernath | 427/96 |
| 5,741,363 A * | 4/1998 | Van Buskirk et al. | 118/715 |
| 5,747,362 A | 5/1998 | Visser | 437/225 |
| 5,763,953 A | 6/1998 | Iijima et al. | 257/762 |
| 5,789,321 A | 8/1998 | Ohshita | 438/680 |
| 5,817,576 A | 10/1998 | Tseng et al. | 438/680 |
| 5,834,068 A * | 11/1998 | Chern et al. | 427/248.1 |
| 5,843,516 A | 12/1998 | Derbenwick et al. | 427/96 |
| 5,846,375 A | 12/1998 | Gilchrist et al. | 156/345 |
| 5,852,088 A | 12/1998 | Dismukes et al. | 524/175 |
| 5,855,675 A | 1/1999 | Doering et al. | 118/719 |
| 5,856,906 A | 1/1999 | Kholodenko et al. | 361/234 |
| 5,859,408 A | 1/1999 | Baxendine | 219/390 |
| 5,860,640 A | 1/1999 | Marohl et al. | 269/289 R |
| 5,866,237 A | 2/1999 | Angelopoulos | 428/209 |
| 5,871,586 A * | 2/1999 | Crawley et al. | 118/715 |
| 5,880,924 A | 3/1999 | Kumar et al. | 361/234 |
| 5,891,348 A | 4/1999 | Ye et al. | 216/67 |
| 5,891,513 A | 4/1999 | Dubin et al. | 427/98 |
| 5,916,359 A | 6/1999 | Baum et al. | 106/287.18 |
| 5,928,427 A | 7/1999 | Hwang | 118/723 E |
| 5,936,829 A | 8/1999 | Moslehi | 361/234 |
| 5,948,467 A | 9/1999 | Nguyen et al. | 427/99 |
| 5,954,887 A * | 9/1999 | Hatano | 134/1.3 |
| 5,956,837 A | 9/1999 | Shiota et al. | 29/559 |
| 5,963,834 A * | 10/1999 | Hatano et al. | 438/680 |
| 6,007,633 A * | 12/1999 | Kitamura et al. | 118/724 |
| 6,015,917 A | 1/2000 | Bhandari et al. | 556/12 |
| 6,073,576 A | 6/2000 | Moslehi et al. | 118/723 E |
| 6,077,353 A | 6/2000 | Al Sharif et al. | 118/500 |
| 6,090,210 A * | 7/2000 | Balance et al. | 118/725 |
| 6,120,605 A * | 9/2000 | Sato | 118/715 |
| 6,162,323 A | 12/2000 | Koshimizu | 156/345 |
| 6,190,495 B1 | 2/2001 | Kubota et al. | 156/345 |
| 6,190,732 B1 * | 2/2001 | Omstead et al. | 427/248.1 |
| 6,197,121 B1 * | 3/2001 | Gurary et al. | 118/725 |
| 6,268,994 B1 | 7/2001 | Logan et al. | 361/234 |
| 6,274,495 B1 * | 8/2001 | Omstead et al. | 438/680 |
| 6,447,632 B1 * | 9/2002 | Shinozuka et al. | 118/715 |

OTHER PUBLICATIONS

Shan, et al., "Process Kit and Wafer Temperature Effects on Dielectric Etch Rate and Uniformity of Electrostatic Chuck"; American Vacuum Society, J.Vac. Sci. Technol. B 14(1), pp. 521–526, Jan./Feb. 1996.

Tian, et al., "Direct Temperature Monitoring for Semiconductors in Plasma Immersion Ion Implantation"; American Institute of Physics, Review of Scientific Instruments, vol. 71, No. 7, pp. 2839–2842, Jul. 2000.

Muramatsu, et al., "Influence of Wafer's Back–Surface Finish on Dry–Etching Characteristics"; American Vacuum Society, J.Vac. Sci. Technol. A 17(5), pp. 3125–3128, Sep./Oct. 1999.

Cote, et al. "An Evaluation of Cu Wiring in a Production 64Mb DRAM," IBM Semiconductor Research and Development Center, IBM Microelectronics Division, Hopewell Junction, NY, Jun. 1998 Symposium on VLSI Technology Digest of Technical Papers, pp. 24–25.

Woo, et al. "A HighPerformance 3.97 $\mu^2$ CMOS SRAM Technology Using Self–Aligned Local Interconnect and Copper Interconnect Metalization," Networking and Computing Systems Group, Process Tehchnology Development, Motorola Inc., Austin, TX, Jun. 1998 Symposium on VLSI Technology Digest of Technical Papers, pp. 12–13.

Zhao, et al. "A Cu/Low–k Dual Damascene Interconnect for High Performance and Low Cost Integrated Circuits" Rockewell Semiconductor Systems, 4311 Jamboree Road, Newport Beach, CA, Jun. 1998 Symposium on VLSI Technology Digest of Technical Papers, pp. 28–29.

Schulz, et al. "A High–Performance Sub–0.25 $\mu$m CMOS Technology with Multiple Thresholds and Copper Interconnects" IBM Semiconductor Research and Development Center, Hopewell Junction, NY, Jun. 1998 Symposium on VLSI Technology Digest of Technical Papers, pp. 18–19.

Denning, et al. "An Inlaid CVD Cu Based Integration for Sub 0.25 $\mu$m Technology" Advanced Products Research and Development Laboratory, Motorola, 3501 Ed Bluestein Blvd., Austin, TX, Jun. 1998 Symposium on VLSI Technology Digest of Technical Papers, pp. 22–23.

English language translation of Abstract from Japanese Patent application No. 10242409, Apr. 30, 1997.

English language translation of Abstract from Japanese Patent Application No. 06203379, Jul. 22, 1994.

English language translation of Abstract from Japanese Patent Application 07057312, Mar. 3, 1995.

XP000555612 Paranjpe, et al., "Chemical vapor deposition TiN process for contact/via barrier applications" Journal of Vacuum Science and Technology: Part B, U.S., American Institute of Physics, New York, Sep. 1, 1995.

XP000531565 Eizenberg, et al., "Chemical vapor deposited TiCN: A new barrier metallization for submicron via and contact applications," Journal of Vacuum Science and technology: Part A, U.S., American Institute of Physics, New York, May 1, 1995.

PCT International Search Report for PCT/US99/30662, May 23, 2000.

English Language Translation of Abstract from Japanese Patent No. 10092977, Apr. 10, 1998.

XP–002121804 Stumm, et al., "Selectivity in low pressure chemical vapor deposition of copper from hexafluoroacety-lacetonate–copper(I)–trimethylvinylsilane in the presence of water" Materials Science & Engineering B (Solid–State Materials for Advanced Technology) pp. 48–53, Feb. 1994.

PCT International Search Report for PCT/US99/15583, Apr. 17, 2000.

* cited by examiner

APPARATUS FOR DISPENSING GAS FOR FABRICATING SUBSTRATES

This application is a divisional from U.S. patent application Ser. No. 09/146,486, filed Sep. 3, 1998 and entitled "Method and System for Dispensing Process Gas for Fabricating a Device on a Substrate," now U.S. Pat. No. 6,190,732.

This application is related to: U.S. patent application Ser. No. 09/484,778 filed Jan. 18, 2000, entitled "Method for Fabricating a Device on a Substrate," now U.S. Pat. No. 6,274,495; U.S. patent application Ser. No. 09/487,393 filed Jan. 18, 2000, entitled "System for Fabricating a Device on a Substrate with a Process Gas", U.S. patent application Ser. No. 09/484,821 filed Jan. 18, 2000, entitled "Apparatus For Supporting A Substrate In A Reaction Chamber".

TECHNICAL FIELD OF THE INVENTION

This invention relates in general to the field of semiconductor device fabrication, and more particularly to a method and system for dispensing process gas for fabricating a device on a substrate.

BACKGROUND OF THE INVENTION

Microelectronic devices, such as integrated circuit (IC) chips formed on a semiconductor substrate wafer, have grown increasing complex over the past several years. By miniaturizing the circuits of the microelectronic devices, industry has achieved significant performance improvements in terms of increased processing speed and decreased footprint. However, the miniaturized circuits are difficult to form. Minor contamination by impurities and other imperfections have greater and greater effects on the integrity of the devices as the size of circuits within microelectronic devices decrease. As industry transitions from the present 0.25 micron circuit devices to devices having smaller circuits, such as 0.18 and 0.13 microns, device formation techniques will have to provide greater precision using a wider variety of materials and with decreased contamination of the device. One example of a new material designed to reduce device size is the use of copper instead of aluminum to form device interconnects.

Microelectronic devices can be formed on substrates in a number of different ways. Some conventional techniques for forming microelectronic devices include rapid thermal processing (RTP), etch processing, and physical vapor deposition (PVD). PVD occurs in a relatively low pressure environment. A target, comprised of the material to be deposited, and the substrate are disposed in a reaction process chamber with a low pressure plasma gas. The target deposits the material on the substrate by the creation of an electric charge difference between the target and the substrate.

Chemical vapor deposition (CVD) is another example of a conventional and well-known process for depositing materials on a substrate to fabricate a microelectronic device on the substrate, such as in the fabrication of a semiconductor IC chip. To achieve a uniform growth of a thin-film material on a substrate, conventional CVD systems attempt to distribute a precursor gas, sometimes in combination with other reactant gases, in a uniform flow over the substrate. Under predetermined conditions for the precursor, such as predetermined temperature and pressure conditions within the CVD reaction process chamber and the substrate, the precursor deposits a desired material on the substrate as the precursor flows over the substrate. For instance, CVD provides excellent thin-film deposition of copper, tantalum nitride, titanium nitride, barium strontium titanate, and other materials typically used as thin-films for device fabrication on a substrate.

PVD and CVD provide different advantages based upon the material to be deposited. For example, CVD provides significant advantages in the deposition of a uniform thin-film of copper on a substrate. However, it is difficult to manufacture microelectronic devices by combining PVD and CVD processes due to the relatively high pressure of the process gas used in the reaction process chamber for CVD compared to the low pressure used for PVD. Further, the gases used to support CVD tend to damage substrates if the CVD gases are inadvertently introduced during a PVD process.

Typically, CVD occurs in a reaction process chamber that provides a low-conductance, contaminant-free environment for flowing the precursor over the substrate in a uniform manner. Alternatively, CVD can be performed in a high-conductance reaction process chamber that provides a relatively large flow of process gas to achieve a uniform film deposition. High-conductance systems generally have a larger footprint than do low-conductance systems, and use a greater amount of process gas for a given film deposition thickness. After deposition, the precursor is evacuated from the reaction process chamber to allow deposition of a subsequent material film, or to allow transfer of the substrate to another reaction process chamber for deposition of the subsequent material film. CVC, Inc. has a hub system that connects a number of reaction process chambers through a central hub to allow transfer of the substrate. The central hub is maintained at a low pressure to minimize the introduction of contaminants during transfer of substrate wafers through the hub.

Conventional single wafer CVD systems feed gases above and perpendicular to the substrate wafer. The gases deflect from the center of the wafer and flow radially from the center to an exhaust port located below the substrate wafer. In such conventional systems, the center of the substrate tends to receive a higher concentration of process chemicals associated with the gases, resulting in faster thin-film material growth at the center of the substrate than at the edges. This can lead to a bell-shaped film thickness with a thicker film at the center of the substrate than at the edge.

To alleviate this difficulty, conventional CVD systems use a showerhead arrangement. The precursor gas flows from above the showerhead into a centrally-located inlet of the showerhead housing. The showerhead housing has a showerhead gas dispersion plate with several hundred small openings to allow a low-conductance flow of the precursor gas to the CVD reaction chamber for more-uniform distribution across the substrate. To encourage a uniform distribution of the precursor gas from the dispersion plate openings, a deflector plate is typically disposed between the incoming gas flow and the dispersion plate. The deflector plate deflects the incoming gas flow radially from the intake vector to fill the showerhead housing with gas before the gas flows through the openings, thus avoiding an excessive concentration of gas flow over the center of the substrate.

Although a deflector plate and showerhead in a conventional CVD system can aid in the relatively uniform distribution of gas across the substrate, this arrangement creates a number of difficulties in the commercial production of microelectronic devices on a substrate wafer. For instance, the process gas inlet at the top of the showerhead increases the height footprint of the system and vertical thickness of the showerhead housing. This can increase the amount of precursor gas needed for deposition of a given film. Further, the inlet and associated fittings increase the difficulty of showerhead maintenance, and the likelihood of contamination during CVD processing. For example, to allow servicing of the showerhead, flexible hoses are often used between the showerhead inlet and process gas source. These hoses impede access to the showerhead housing, and can include particulate contaminates that can break free during CVD processing to introduce contaminants to the substrate.

Another difficulty associated with conventional CVD systems relates to system throughput. During CVD processing, gases are distributed from the showerhead inlet, through the dispersion plate and across the substrate with a low-conductance uniform flow. After deposition of the desired film, gas flow through the inlet is ceased by a shutoff valve, and residual gases are removed from reaction chamber through an exhaust located at the bottom of the reaction chamber. This results in process gas flowing over the entire length of the reaction chamber. Once the residual gas is removed from the reaction chamber, the substrate can be removed from the reaction chamber for further processing. For instance, the hub system sold by CVC, Inc. can move the substrate between several reaction chambers through a central hub, thus minimizing contamination of the substrate between the deposition of different material layers in separate reaction chambers.

To minimize contamination of the hub and associated reaction chambers during substrate handling, a thorough evacuation of residual gases upon completion of a deposition process is generally accomplished before transfer of the substrate through the hub. The low conductance of the reaction chamber and showerhead dispersion plate openings tends to increase the time needed to evacuate the reaction chamber since the evacuation pump has to draw residual process gas through the openings for evacuation of the showerhead housing. In low-conductance systems, baffles associated with the reaction chamber also impede evacuation of residual gas. Further, even with an extensive evacuation time, residual gas typically remains in the precursor delivery line, the showerhead housing and the reaction chamber, resulting in plating of material from the precursor on the wafer handling system, such as the wafer chuck, when the residual gas decomposes, and eventual contamination of the system. Increased evacuation time can decrease the presence of residual gas, but even extensive evacuation times generally cannot eliminate the residual gas from the showerhead and reaction chamber before transfer of the substrate wafer through the hub. The increased evacuation times lead to a corresponding decrease in system throughput.

Another difficulty of conventional CVD systems results from CVD processes that use two or more gases to deposit a material on a substrate. For instance, a precursor and reducing gas chemically support deposition of a material on a substrate, but are chemically incompatible if mixed before delivery to the substrate. If the precursor and reducing gas are mixed in the delivery line or showerhead housing before flowing to the reaction chamber, they will generate particles that cause blockage of the gas delivery system and that can cause undesired composition of the film material.

One conventional technique for delivery of plural gases without premixing is to use a multi-zone showerhead. The incompatible gases are fed into separate rings in the showerhead housing for delivery to the reaction chamber by separate concentric zones of dispersion plate openings. However, the multiple zones typically result in the deposited film having a ring pattern similar to the pattern of the zones of the dispersion plate. Multiple zones designed with smaller zones to minimize the ring-pattern of the deposited film also have an increased resistance to flow in each zone. The increased flow resistance decreases system throughput by increasing pumping and purging cycle times and can cause condensation of pressure-sensitive precursor vapor.

Further, the multi-zone showerhead design is difficult to manufacture and inflexible with respect to its use with various combinations of gases, flow rates and reactor geometries.

Another difficulty associated with CVD relates to the deposition of the material from the precursor gas to the reaction chamber walls and to the chuck that supports the substrate in the reaction chamber. CVD of a copper film presents increased difficulty due to the narrow range of conditions in which the copper precursor is stable. For instance, one typical copper precursor will decompose at temperatures above 100 C., and will condense at temperatures below 50 C. Thus, over a series of CVD depositions, a reaction chamber and chuck used for copper deposition tends to have a residual film of copper build, which can interfere with subsequent depositions.

SUMMARY OF THE INVENTION

Therefore a need has arisen for a method and system which supports increased throughput of uniform thin film deposition of a material on substrates for device formation on the substrates.

A further need exists for a method and system that supports low-conductance process gas flow in a reaction chamber for chemical vapor deposition and high-conductance process gas flow for evacuation of the reaction chamber after deposition.

A further need exists for a method and system which supports increased throughput of uniform thin film deposition of multiple material layers for device formation using chemical vapor deposition of one or more layers and physical vapor deposition of one or more layers.

A further need exists for a method and system which supports deposition of a material for device formation on a substrate in a reaction chamber using a process gas with reduced evacuation time for the evacuation of the process gas from the reaction chamber after deposition is complete.

A further need exists for a method and system which supports deposition of a film on a substrate having a precise and uniform thickness by a process gas without deposition of the film on the chuck supporting the substrate.

A further need exists for a method and system which provides rapid evacuation of residual gas from a chemical vapor deposition showerhead after completion of the deposition of a film with the gas.

A further need exists for a method and system which dispenses process gas into a reaction chamber using a reduced footprint.

A further need exists for a method and system which supports increased throughput of uniform thin film deposition of a material for device formation on a substrate using plural process gases, such as chemical vapor deposition with plural reaction gases.

A further need exists for a method and system which allows increased flexibility in the configuration and maintenance of equipment used for deposition of material layers using process gases, such as by chemical vapor deposition of a material.

A further need exists for a method and system which reduces the presence of contaminants during deposition of a material as a thin film for device formation on a substrate using a process gas, such as by chemical vapor deposition of a material.

In accordance with the present invention, a method and system are provided that substantially eliminate or reduce disadvantages and problems associated with previously developed methods and systems for deposition of a uniform thin film of a material for device formation on a substrate.

The method and system according to the present invention use a reaction chamber that contains a heated substrate support chuck for supporting and heating a substrate during deposition of a material film. The reaction chamber accepts process gas to support deposition of the material, and has an exhaust port for evacuating the process gas as needed. For instance, CVD process gas flows from a showerhead, over the substrate and then out the exhaust port. The reaction chamber has a low-conductance configuration to provide an axisymetric process gas flow over the substrate during deposition, and a high-conductance configuration to provide enhanced evacuation of the reaction chamber after the completion of deposition. The low-conductance configuration provides optimal process gas flow to enhance the deposition of a uniform film on the substrate, and the high-conductance configuration enhances process throughput by reducing the post-process evacuation time.

More specifically, one embodiment of the present invention uses the position of the chuck relative to the exhaust port to provide a low-conductance configuration during deposition of a material by a process gas, and to provide a high-conductance configuration during evacuation of residual gas after deposition of the material by the process gas. The exhaust port is located along a side wall of the reaction chamber. An actuator or adjusting motor positions the chuck in substantial alignment with the exhaust port to support, so that the chuck restricts the flow path from the showerhead to the exhaust port, to support a low-conductance configuration for deposition with the process gas. To support a high-conductance configuration for evacuating the reaction chamber, the chuck is position away from the showerhead and exhaust port to avoid impedance of the flow of process gas from the reaction chamber to the exhaust port.

The chuck has a support region for supporting the substrate wafer proximate the showerhead, a backside region on the opposite side that faces the backside of the reaction chamber, and an indented region formed between the support region and the backside region. In the low conductance configuration, the support region and backside region form a gap next between the chuck and the reaction chamber walls. The gap formed by the support region restricts process gas flow from the showerhead to the exhaust port, and the gap formed by the backside region restricts the flow of process gas to the backside of the reaction chamber. The indented region provides a channel in substantial alignment with the exhaust port to allow process gas to flow through the support region gas in a uniform, axisymetric flow. The channel directs process gas flow from the indented region to the exhaust port for evacuation. In the high conductance position, the chuck has openings in the support and backside region to enhance evacuation of residual gas from the backside of the reaction chamber and from the indented region through the exhaust port. The chuck includes a thermal energy distribution apparatus to provide precise control of the temperature across the substrate wafer according to predetermined deposition conditions, and to reduce deposition of the material on the chuck by maintaining the chuck at temperatures that limit deposition.

An alternative embodiment of the present invention uses plural evacuation openings to provide a high-conductance configuration during evacuation of residual gas after deposition of the material by the process gas. For instance, an evacuation opening is provided in the showerhead housing to allow direct evacuation of the showerhead without evacuating the residual gas through the low-conductance gas dispersion plate. In conjunction with evacuation of the housing, purge gas is provided through the process gas feed to purge residual gas from the process gas feed line and to help force residual gas from the housing.

Another embodiment of the present invention provides improved process gas dispersion using a reduced footprint. A showerhead housing accepts a reactant gas, such as a precursor for chemical vapor deposition of a material, through a reactant gas inlet opening located on the side of the housing. The reactant gas enters the housing through the side opening along a flow vector that is generally parallel to the exposed upper surface of a substrate disposed in a reaction process chamber associated with the housing. A baffle is disposed in the housing proximate the inlet opening for redirecting the flow vector of the gas to an outflow vector that is generally perpendicular to the surface of the substrate. The reactant gas flows along the outflow vector through a gas dispersion plate to uniformly flow over the substrate, allowing the reactant gas to deposit a desired material on the substrate surface.

In an alternative embodiment, the showerhead housing can accept plural separate gas flows through plural process gas feed openings located on the side of the housing. A first process gas flows into a first plenum disposed in the showerhead housing. A second process gas flows into a second plenum disposed in the showerhead housing. A baffle associated with each plenum redirects the respective process gas flow to an outflow vector for dispensing to the substrate. Passageways provide a flow path for the first process gas to flow from the first plenum, through the second plenum and into the reaction chamber without mixing with the second process gas flow until both process gas flows enter the reaction chamber. The passageways feed the first process gas flow to openings of a gas dispersion plate for dispensing the flow to the reaction chamber. The second process gas flow passes through openings in the gas dispersion plate and into the reaction chamber. The openings associated with passageways and the openings associated with the second plenum are arranged in geometric patterns that correlate to a desired flow pattern. The geometric patterns can include squares, triangles, hexagons and octagons.

The present invention provides important technical advantages for the deposition of a uniform thin film of a material on a substrate to form a device using chemical vapor deposition. One important technical advantage is the greater throughput of the present invention. Increased throughput is provided by reduced purge and evacuation cycles needed to remove residual process gas from the reaction chamber.

Another important technical advantage is the combined high-conductance and low-conductance configurations available with the present invention. Low-conductance provides uniform axisymetric process gas flow over the substrate with a reduced footprint and reduced usage of process gas. High-conductance allows rapid evacuation of residual gas upon completion of a deposition cycle. The combination of a low and high conductance configuration in a single system provides the advantages of both types of deposition, leading to greater throughput and reduced risk of contamination by residual gas.

Another technical advantage of the present invention is an enhanced capability to combine CVD and PVD reaction chambers along a single hub system. The improved evacuation of residual gas provided by the present invention allows substantially complete removal of residual gas from the reaction chamber and showerhead in a time period that makes throughput of combined PVD and CVD chambers economically feasible.

Another technical advantage of the present invention is the precise control of substrate thermal levels to enhance uniform film deposition across the substrate without deposition on the chuck.

Another technical advantage of the present invention is the reduced evacuation time provided by direct evacuation from the showerhead housing without evacuation of residual gas through the gas dispersion plate. By allowing evacuation of residual gas from both the reaction chamber and the showerhead housing, the present invention reduces the time needed to purge the system in support of wafer handling for further deposition processing.

Another important technical advantage of the present invention is the reduced footprint of the showerhead housing achieved by the side feed of process gas. Reduced footprint can mean substantial savings by allowing room for a greater amount of equipment in the expensive clean rooms used to produce microelectronic devices. Further, feeding process gas to the side of the housing provides improved accessibility for maintenance of the showerhead, and reduced risk of contamination breaking free from flexible hose assemblies.

Another technical advantage of the present invention is the ability to provide a uniform mixture of plural process gases to the reaction chamber without mixing the gases in the housing. The geometric shapes of the openings associated with separate plenums for separate process gas flows enables uniform flow and mixture of the process gases to the reaction chamber. The uniform flow and mixture reduces ring-shaped deposition on the substrate and allows precise control of process gas flows.

Another technical advantage is that gases are fed from an enclosed, vented gas box into the showerhead in a safe manner. For instance, all connections can be "dual contained" connections to limit dangers related to gas leakage. Any leakage of toxic gas at these connections can be scavenged by differential pumping and safely removed.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein.

DETAILED DESCRIPTION OF THE INVENTION

CVD provides many advantages as a technique for the deposition of uniform thin film materials on a substrate for the formation of microelectronic devices. Under properly controlled conditions, CVD allows the deposition of uniform and precise thicknesses of a number of materials. However, the deposition of quality material films by CVD requires a uniform flow of CVD process gases in a clean environment with minimal contamination by particulate and other impurities.

For instance, CVD of copper is accomplished by flow of a copper-carrying precursor, such as CUpraSELECT™, over the substrate at predetermined temperature and pressure conditions. The precursor decomposes, releasing the copper material to deposit on the substrate. By maintaining a uniform flow of the precursor over the substrate, a uniform copper film is deposited on the substrate. However, once the deposition of the material film is complete, residual precursor present in the CVD system can result in undesired deposition of copper throughout the system, including on the wafer chuck that supports the substrate, on the gas dispersion plate and in the gas feed equipment that directs the precursor flow to the showerhead and reaction process chamber. Materials deposited by residual process gas creates a potential contaminant to subsequent deposition processes, especially if the material is dislodged during system maintenance. Further, residual gas can contaminate hub equipment during wafer handling, resulting in damage to devices, especially if the CVD process gases contaminate related reaction chambers that are incompatible with CVD gases, such as PVD reaction chambers.

Figure 1:
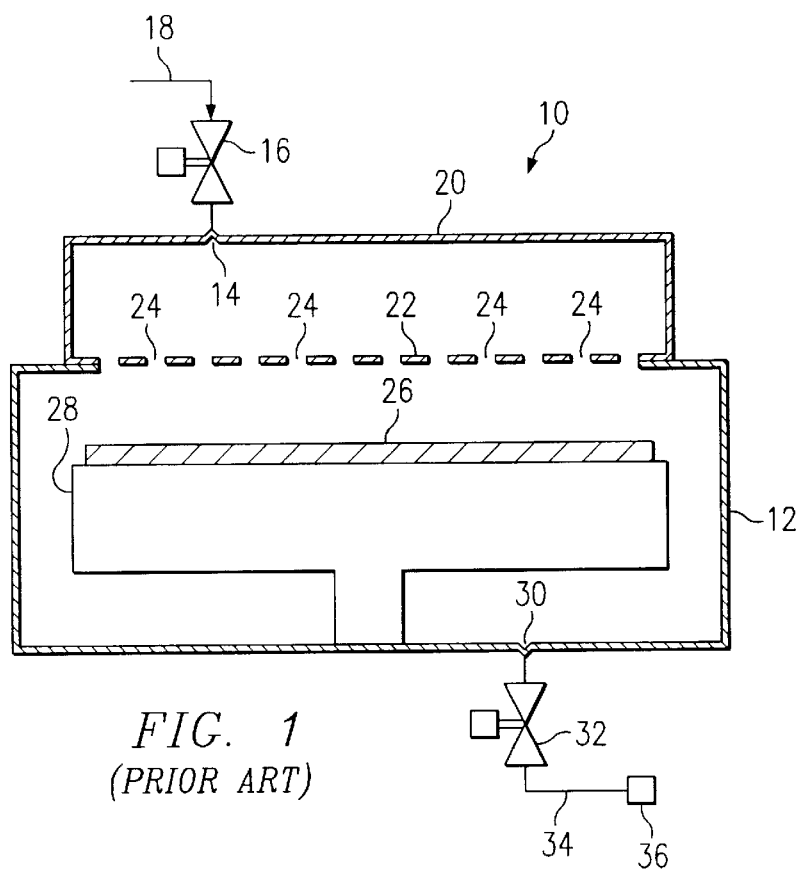
FIG. 1 depicts a side cutaway view of a conventional CVD system.

Referring now to FIG. 1, a side cutaway view of a conventional CVD system is depicted. A showerhead assembly 10 rests on a reaction chamber 12. Showerhead assembly 10 accepts process gas through a gas feed opening 14 in communication with a gas feed valve 16 and gas feed line 18. Process gas flows from gas feed opening 14 into a showerhead housing 20. A gas dispersion plate 22 has a plurality of small openings 24 to disperse the process gas into reaction process chamber 12. A substrate 26 rests on a substrate support chuck 28 beneath a gas dispersion plate 24. Process gas flows over the substrate 26 to deposit a desired material, and is then evacuated from reaction chamber 12 through a process chamber evacuation opening 30, a process chamber evacuation valve 32 and process chamber evacuation line 34 by an evacuation pump 36. An axisymetric process gas flow is provided over substrate 26 by either restricting the process gas flow as a choked flow with baffles in a low-conductance chamber, or by providing an increased gas flow using a high-conductance chamber. Side pumping is not directly feasible in this configuration.

Figure 2:
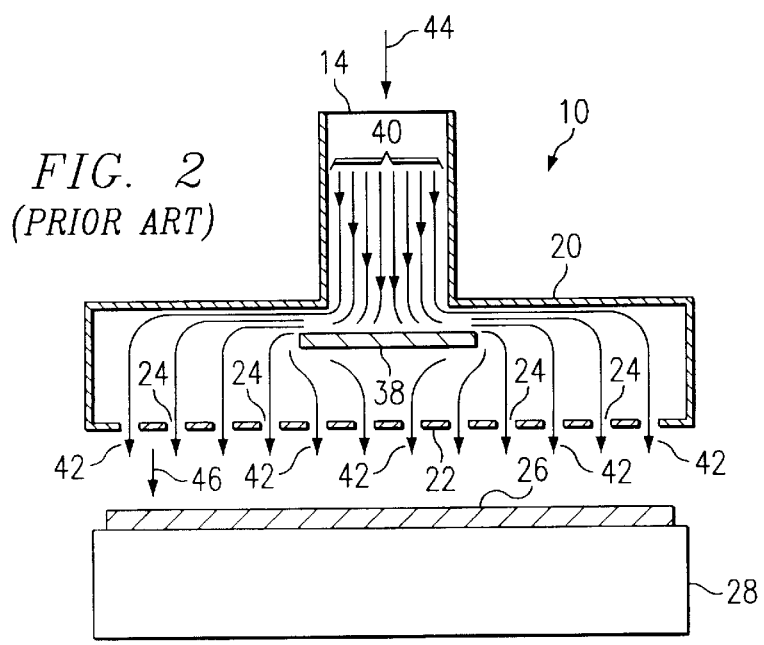
FIG. 2 depicts a side cutaway view of a conventional CVD showerhead assembly having a deflector plate.

Referring now to FIG. 2, a conventional CVD system is depicted with a deflector plate 38 for dispersing the incoming process gas flow 40 throughout housing 20 before dispersion of the process gas as an outgoing gas flow 42 through gas dispersion plate openings 24. Incoming gas flow 40 enters the top of housing 20 through gas feed opening 14 along an intake vector 44, and exits housing 20 along an outflow vector 46 that is substantially parallel to intake vector 44. The low conductance of the small gas dispersion plate openings 24 aid in providing a uniform process gas flow over substrate 26 by creating a slight back pressure in housing 20. However, the low conductance of openings 24 and the presence of deflector plate 38 tend to slow the evacuation of process gas through process chamber evacuation opening 30 located in reaction chamber 12 below substrate support chuck 28.

Conventional CVD process reaction chambers use either a high or low-conductance process flow. Each type of flow offers offsetting advantages and disadvantages. A high-conductance reaction chamber has a greater footprint and uses a larger amount of process gas for a given film deposition, but offers decreased process time and increased throughput by allowing more rapid evacuation of the reaction chamber. In contrast, a low-conductance reaction chamber provides a uniform process gas flow by choking the flow, which tends to use less process gas but increases reaction chamber evacuation time.

Figure 3:
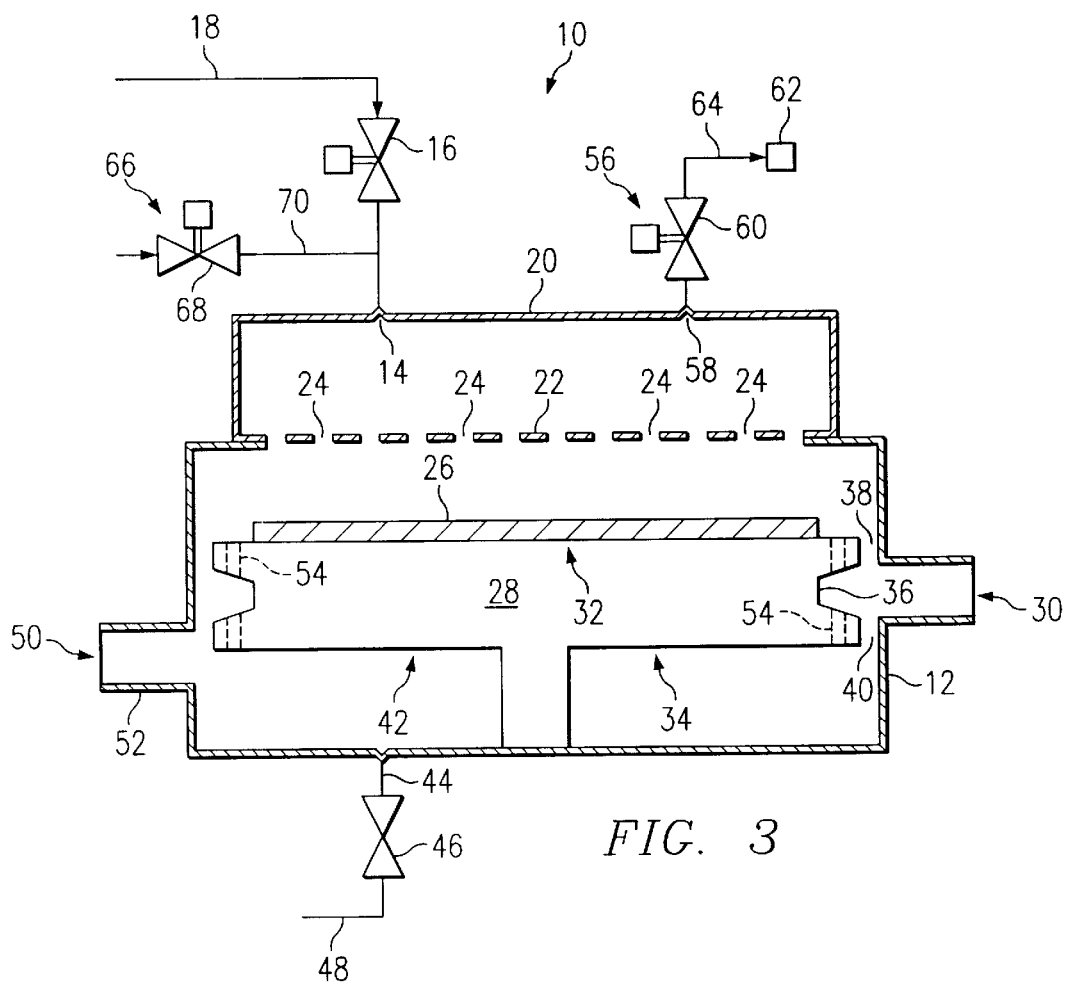
FIG. 3 depicts a side cutaway view of a CVD system having a low-conductance and a high conductance configuration and a showerhead housing evacuation system.

Referring now to FIG. 3, a deposition system is depicted according to the present invention, having a high-conductance and low-conductance configuration. Housing 20 accepts process gas through gas feed opening 14, gas feed valve 16 and gas feed line 18. Gas dispersion plate 22 disperses a uniform process gas flow to substrate 26 supported on substrate support chuck 28 in reaction chamber 12. Chuck 28 has a support region 32 for supporting substrate 26, a backside region 34 and an indented region 36. Support region 32 and the walls of reaction chamber 12 form a uniform gap 38 to choke the flow of process gas from gas dispersion plate 22 to exhaust port 30. For instance, one typical configuration for reaction chamber 12 is a cylinder shape with support region 32 having a support surface circumference slightly smaller than the circumference of reaction chamber 12.

Indented region 36 enhances an axisymetric process gas flow by equalizing the pressure beneath support region 32. An isobaric condition is created by the difference in conductance between the gap 38 and the conductance of indented region 36. The equalized pressure associated with indented region 36 supports axisymetric process gas flow over substrate 26, into indented region 36, and then out exhaust port 30. The uniform axisymetric process gas flow over substrate 26 allows uniform film deposition or etch, which can be further enhanced by temperature manipulation of support chuck 28. If, as described above, reaction chamber 12 is a cylinder and support region 32 has a circular shape, then indented region 36 is an indented annular ring around the circumference of chuck 28.

Backside region 34 defines the bottom portion of indented region 36 and forms a back side gap 40 in cooperation with reaction chamber 12. Backside gap 40 reduces flow of process gases from indented region 36 to the backside 42 of process chamber 12. To protect components in backside 42 of process chamber 12, a purge gas opening 44, purge gas valve 46 and purge gas line 48 provide a purge gas, such as argon, to backside chamber 42. The purge gas enters indented region 36 through backside gap 40 with a sufficient flow to minimize process gas flow into backside chamber 42.

In operation, support chuck 28 raises substrate 26 to a position proximate gas dispersion plate 22. Process gas flows through process feed opening 14 into housing 20. Gas dispersion plate 22 provides a uniform low-conductance process gas flow over substrate 26 through gap 38 into indented region 36 and out exhaust port 30. A simultaneous purge gas flow from purge gas opening 44 limits process gas flow into backside chamber 42. Substrate support chuck 28 enables a low-conductance choked flow over substrate 26 by substantially aligning indented region 36 with exhaust port 30.

Upon completion of deposition or etching by the process gas, process gas feed valve 16 eliminates process gas flow to housing 20. Support chuck 28 lowers away from gas dispersion plate 22 to align substrate 26 with substrate wafer handling port 50. A mesa valve 52 associated with substrate wafer handling port 50 prevents the flow of process gas through wafer handling port 50 until evacuation of reaction chamber 12 is complete.

Once support chuck 28 is aligned with wafer handling port 50, residual process gas remaining in reaction chamber 12 between gas dispersion plate 22 and substrate 26 has an unrestricted flow path to exhaust port 30, thus providing a high-conductance arrangement for enhancing evacuation of residual gas from reaction chamber 12. Openings 54 in support chuck 28 enhance the flow of residual gas from backside chamber 42 and indented region 36 to enhance evacuation from those regions. Purge gas feed 44 continues to provide purge gas to backside chamber 42 to force residual process gas from backside chamber 42 and indented region 36. Openings 54 are obstructed during deposition in the low-conductance arrangement and unobstructed during evacuation.

Movement of support chuck 28 to the high-conductance position for reducing the restriction of process gas from reaction chamber 12 to exhaust port 30 enables more rapid evacuation of reaction chamber 12. However, gas dispersion plate 22 continues to restrict flow from housing 20 of showerhead assembly 10. To enhance evacuation of residual process gas from housing 20, a showerhead evacuation assembly 56 is in flowing communication with housing 20. A housing evacuation opening 58 allows flow of residual process gas from housing 20 when a housing evacuation valve 60 is opened. A housing evacuation pump 62 evacuates residual process gas from housing 20 through housing evacuation line 64, thus providing a high-conductance evacuation of showerhead assembly 10 without evacuating the residual gas from housing 20 through gas dispersion plate 22.

To further enhance complete evacuation of residual gas from showerhead assembly 10, a showerhead purge assembly 66 is in fluid communication with housing 20. A purge valve 68 opens to allow flow of a purge gas through purge gas feed 70 into gas feed opening 14, thus enabling complete evacuation of process gas from gas feed line 18. Purge gas flows from gas feed opening 14 into housing 20 for evacuation from housing evacuation opening 58. The location of gas feed opening 14 on an opposite side of the housing 20 relative to housing evacuation opening 58 provides an evacuation flow that encompasses the entire interior of housing 20 to further enhance complete evacuation of residual process gas. In one alternative embodiment, gas feed opening 14 can be configured in fluid communication with housing evacuation pump 62 to allow evacuation from the housing through a single opening.

To remove substrate 26 from reaction chamber 12, purge gas feed 44 and showerhead purge assembly 66 cease the flow of purge gas so that housing evacuation pump 62 and a reaction chamber evacuation pump associated with exhaust port 30 can remove purge gas and any residual process gas from showerhead assembly 10 and reaction chamber 12. Once reaction chamber 12 reaches a predetermined pressure, mesa valve 52 opens to allow removal of substrate 26 by substrate wafer handling equipment associated with the central hub. Another substrate 26 is then inserted through mesa valve 52 onto support chuck 28. Support chuck 28 raises to the low-conductance position, mesa valve 52 closes to isolate reaction chamber 12, and deposition of a material film with the process gas can proceed.

Figure 4:
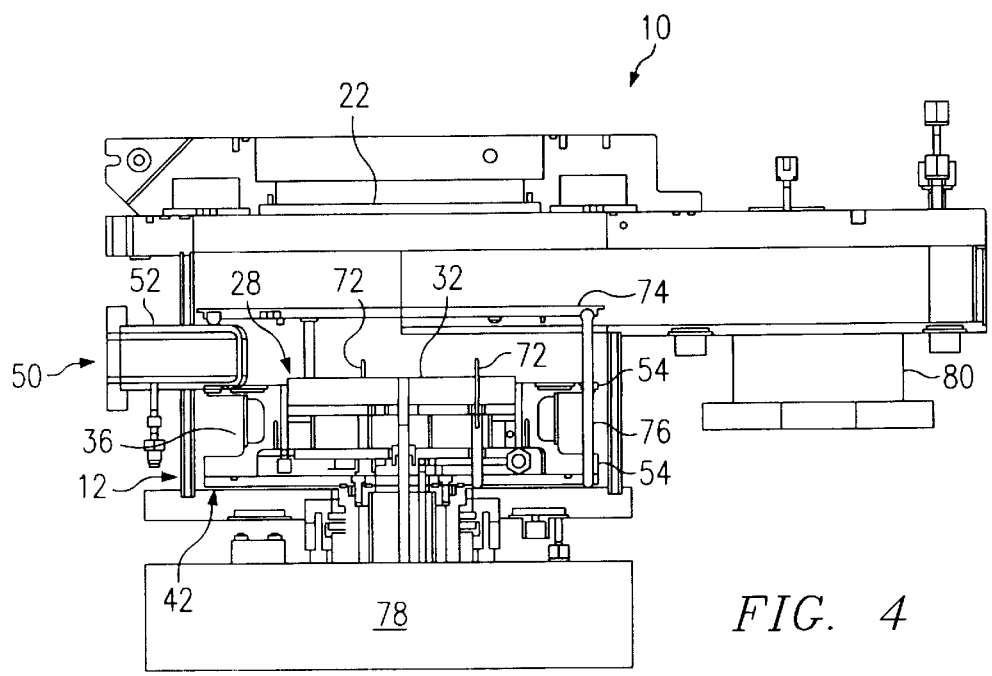
FIG. 4 depicts a side cutaway view of reaction chamber and chuck in a high-conductance configuration.

Referring now to FIG. 4, a detailed side cutaway view of reaction chamber 12 and support chuck 28 are depicted with support chuck 28 in a lowered high-conductance position for accepting a substrate from wafer handling port 50 through mesa valve 52. When the substrate is inserted, it initially rests on substrate wafer lift rods 72 above substrate chuck 28 support region 32. Lift rods 72 are pushed to a raised position by contact against the bottom of reaction chamber 12 in backside chamber 42. A clamp assembly 74 is raised above support surface 32 by clamp lift rods 76, which are also in contact with the base of reaction chamber 12 in backside chamber 42. Clamp 74 is an annular ring with an inside clamping edge substantially aligned with the outside edge of the substrate to be clamped. Clamp lift rods 76 pass through openings 54 of support chuck 28 so that, when clamp 74 is lowered to support surface 32, openings 54 are obstructed to prevent process gas flow from reaction chamber 12 to indented region 36 and backside chamber 42 during deposition with process gas.

Figure 5:
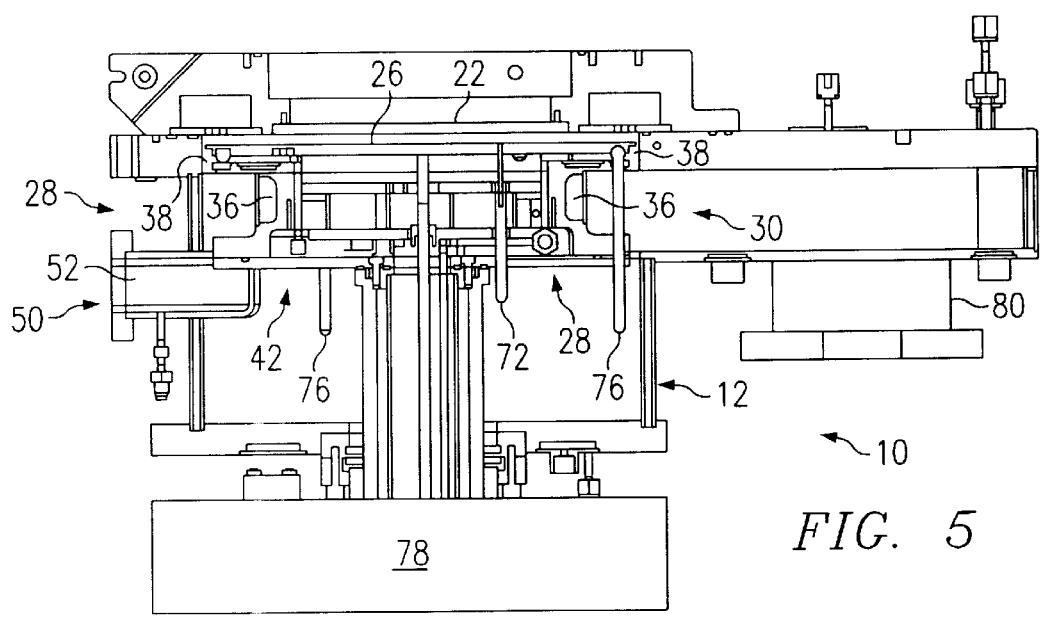
FIG. 5 depicts a side cutaway view of a reaction chamber and chuck in a low-conductance configuration.

Referring now to FIG. 5, substrate support chuck 28 is depicted in a raised low-conductance position. Chuck adjusting motor 78 raises chuck 28 from the base of reaction chamber 12 to bring substrate 26 proximate to gas dispersion plate 22 of showerhead assembly 10. As chuck adjusting motor 78 raises support chuck 28, substrate wafer lifting pin 72 lowers to a supported position within chuck 28 to bring substrate 26 proximate to support surface 32 of chuck 28. Once substrate 26 is in position, clamp rods 76 lower to a supporting position within substrate chuck 28 to allow clamp 74 to secure substrate 26 in position. Clamp 74 also obstructs openings 54 to prevent process gas flow through openings 54 during deposition.

Once support chuck 28 is raised to a position proximate to gas dispersion plate 22, reaction chamber 12 is in a low-conductance configuration to support deposition of a material film by process gas onto substrate 26. Process gas flows through gas dispersion plate 22 in an axisymetric flow to pass through gap 38 into indented region 36, which is substantially aligned with exhaust port 30. A reaction chamber exhaust pump 80 evacuates process gas from indented region 36 to insure an even gas flow during deposition.

Figure 6:
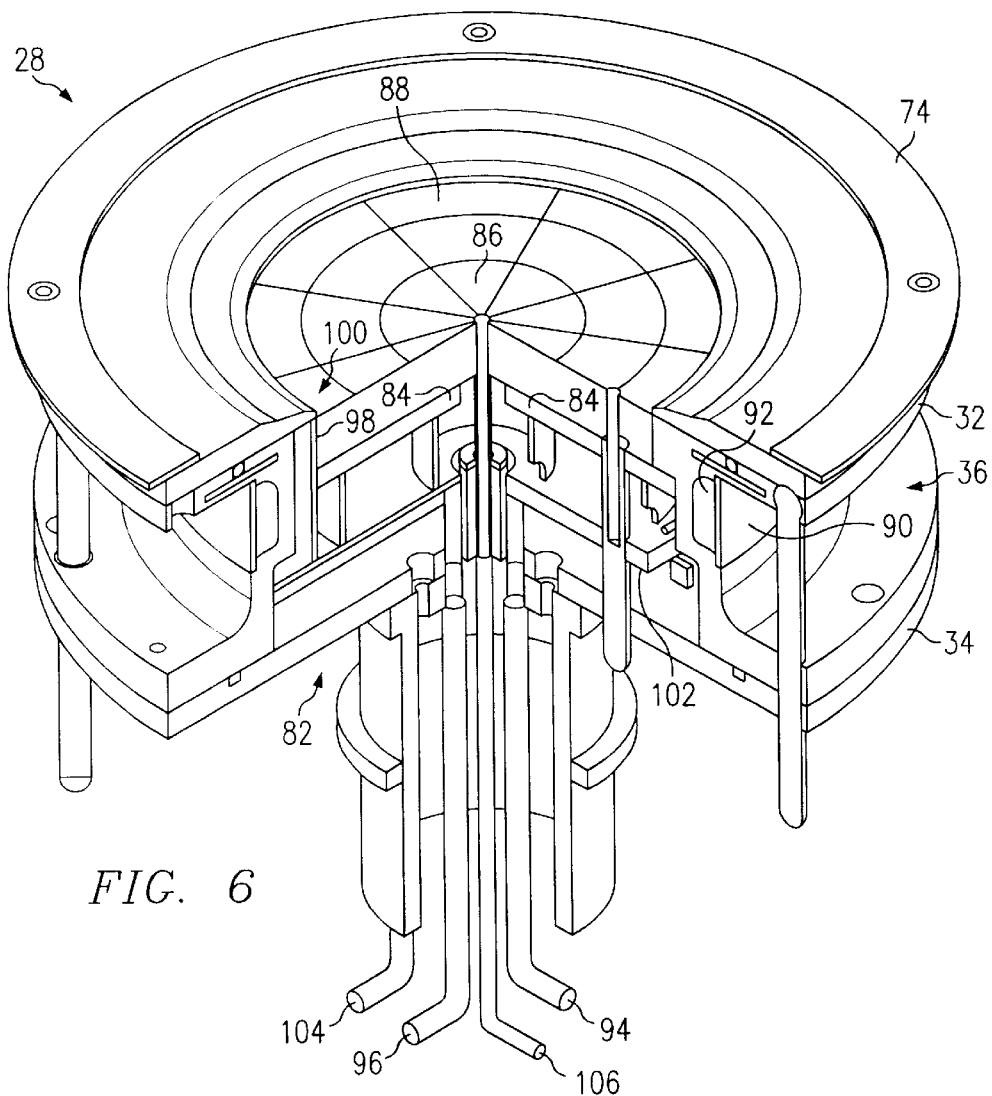
FIG. 6 depicts a upper three-dimensional cutaway view of a dual conductance chuck for supporting modulation between a high and low conductance configuration and for providing thermal control.

Referring now to FIG. 6, a side cutaway three-dimensional view of support chuck 28 is depicted. Support chuck 28 has a circular shape to accommodate substrate wafers having a circular shape. Thus, indented region 36 is an annular ring formed between support region 32 and backside region 34. Support region 32 and backside region 34 extend outward from support chuck 28 to act as baffles in cooperation with the side walls of reaction chamber 12. In alternative embodiments, support chuck 28 can have alternative geometric shapes to support corresponding substrate wafer shapes. For instance, a square-shaped chuck could be used to support deposition of thin films on square-shaped substrates.

During deposition of a film on a substrate, different process gases deposit film material at different predetermined temperature and pressure conditions. Support chuck 28 includes a thermal energy distribution apparatus 82 to control the thermal energy state of a substrate supported proximate to support region 32. A multi-zone heater 84, which can comprise a plurality of resistive or conductive heating elements or other heat transfer devices, is disposed proximate to substrate support region 32. Heater 84 provides thermal energy for increasing the temperature of substrate 26 to the predetermined temperature needed for deposition. Heater 84 can apply different levels of thermal energy across support region 32 to vary the distribution of thermal energy to the substrate. For instance, heater 32 provides a first level of thermal energy to inner thermal zone 86 and a second level of thermal energy to middle thermal zone 88. In operation, middle thermal zone 88 can be maintained at a higher temperature than inner thermal zone 86 to provide a greater deposition rate along the substrate associated with middle thermal zone 88. The varying temperatures can compensate for greater process gas flow concentrations that can occur at the center of the substrate.

Support chuck 28 has an edge thermal zone 90 associated with clamp 74 and indented region 36. Edge thermal zone 90 is maintained at a predetermined temperature to minimize deposition on clamp 74 and along indented region 36. Thus, clamp 74 and indented region 36 will not build residual layers of a film over repeated deposition processes. To maintain edge thermal zone 90 at an appropriate temperature, fluid channels 92 are disposed within chuck 28 proximate to clamp 74 and indented region 36. Fluid channels 92 support the flow of a fluid, such as water, that accepts excess thermal energy for removal from edge thermal zone 90. Thermally regulated fluid passes through fluid intake line 94 to channels 92 and is removed through fluid exhaust line 96.

Thermal energy distribution apparatus 82 includes a perimeter heater 98 located along the edge of middle thermal zone 88 to provide precise temperature control along the outer edge of the substrate at the intersection of clamp 74. A groove 100 defines the boundary between middle thermal zone 88 and edge thermal zone 90 to reduce thermal conductance, and to allow expansion of support region 32. Thus, for instance, perimeter heater 98 maintains precise temperature control along the edge of a substrate while channels 92 remove excess thermal energy at edge thermal zone 90 to prevent or limit material film deposition on clamp 74 and along indented region 36.

Thermal energy distribution apparatus 82 includes thermal transfer plates 100 and thermally controlled plates 102 to provide enhanced control of the level of thermal energy associated with support region 32. Thermal transfer plates 100 are annular rings of thermally conductive material in thermal communication with inner thermal zone 86 and middle thermal zone 88. Thermal transfer plates 100 can either accept excess thermal energy from their respective thermal zones or provide additional thermal energy as needed to provide precise control of the thermal energy level for each zone. Thermal transfer plates 100 are in thermal communication with thermally controlled plate 102 disposed along backside region 34 of chuck 28. Thermally controlled plates 102 can provide thermal energy to thermal transfer plates 100, or can accept thermal energy from thermal transfer plates 100 in order to adjust the relative thermal energy level of the associated thermal zone of support region 32.

For instance, if heater 84 provides an excessive level of thermal energy to inner thermal zone 86, then heater 84 can reduce or eliminate its thermal input to inner thermal zone 86, leading to an eventual lowering of the thermal energy level associated with inner thermal zone 86. Thermal transfer plate 100 and thermally controlled plate 102 associated with inner thermal zone 86 increase the responsiveness of thermal energy level changes to inner thermal zone 86 by cooling thermally controlled plate 102 and transferring excess energy from inner thermal zone 86 to thermally controlled plate 102 through the associated thermal transfer plate 100. Alternatively, thermally controlled plate 102 can be heated to a higher thermal level, allowing transfer of thermal energy through thermal transfer plate 100 to inner thermal zone 86, thus increasing the thermal energy level of inner thermal zone 86. The thermal energy level of thermally controlled plate 102 is increased by a heater associated with thermally controlled plate 102, and decreased by passing fluid, such as fluid from fluid intake line 94, proximate to or through thermally controlled plate 102.

Support chuck 28 also supports enhanced backside gas treatment of a substrate wafer, as is described in greater detail in U.S. Pat. No. 6,073,576 entitled "Substrate Edge Seal And Clamp For Low-Pressure Processing Equipment" by Moslehi, assigned to CVC, Inc. Gas is provided through enhanced backside gas feed 104 for introduction from the side of the wafer along the full periphery of the clamp. The gas flows from the outer perimeter of the wafer to the middle of the wafer, where the gas is removed through gas return line 106. Enhanced backside gas processing enables transfer of thermal energy from support region 32 to a substrate wafer without physical contact between support region 32 and the wafer. By using a nonreactive gas, such as argon or helium, enhanced backside gas flow reduces inadvertent deposition of the material on support region 32.

Figure 7A:
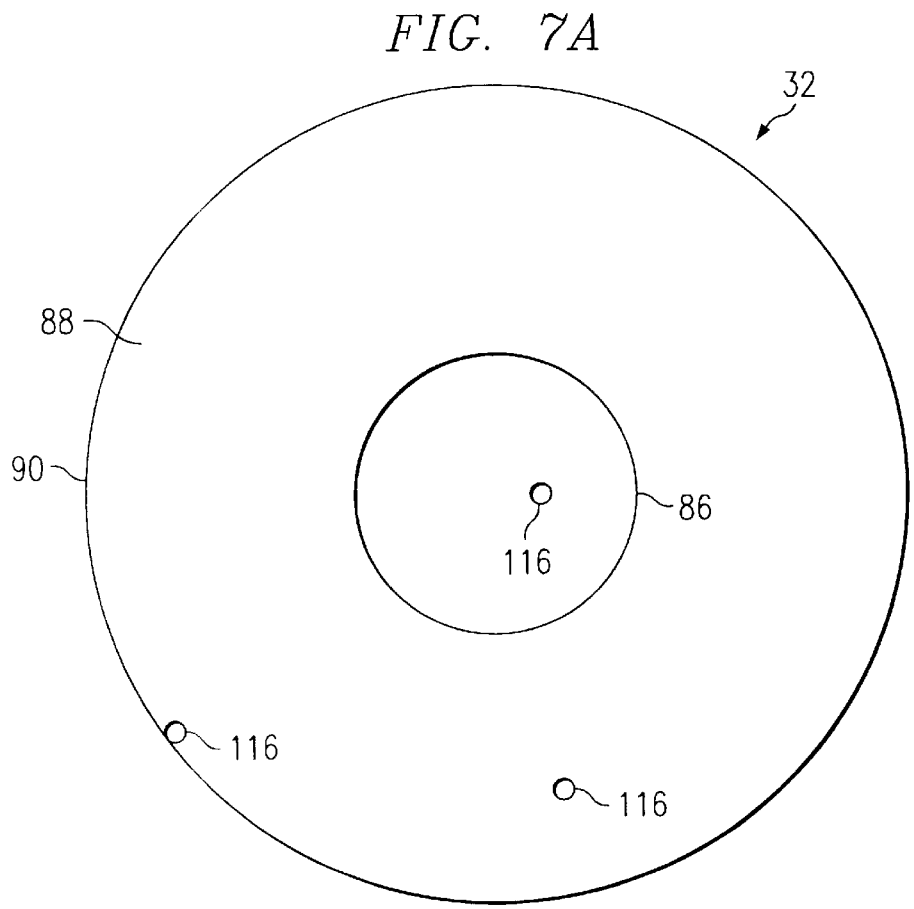
FIG. 7A depicts a top view of a chuck substrate support surface with plural thermal zones.
Figure 7B:
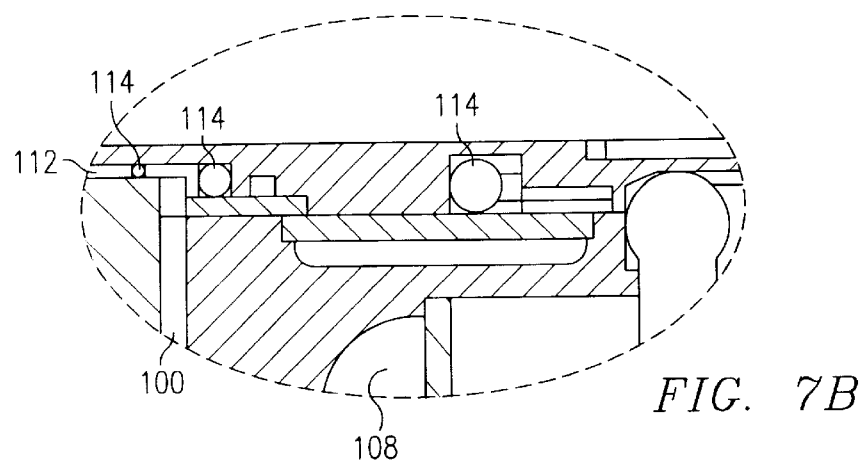
FIG. 7B is an expanded view of a thermal zone of the chuck illustrated in FIG. 7.
Figure 7:
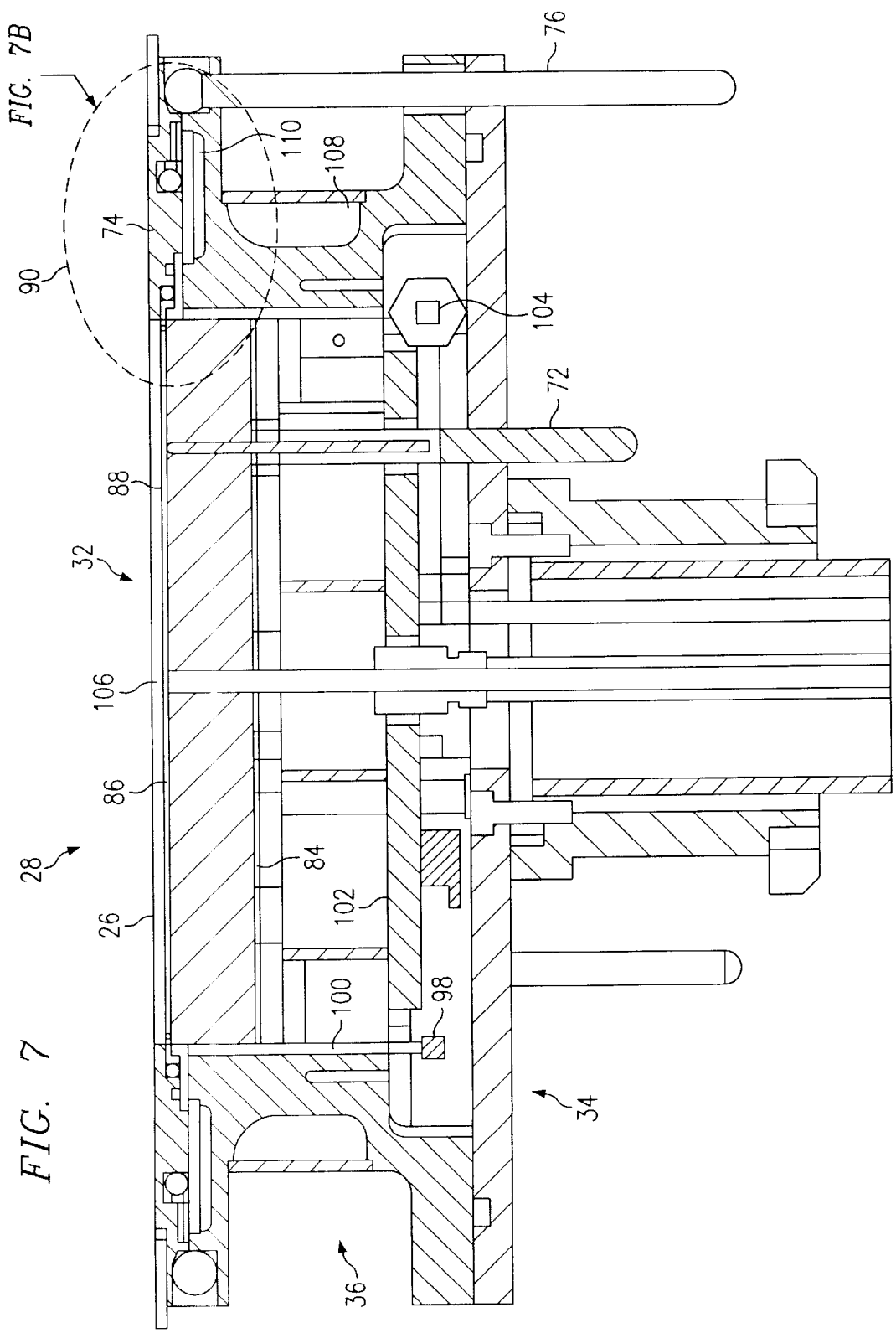
FIG. 7 depicts a side cutaway view of a dual conductance chuck with thermal control and enhanced backside gas flow.

Referring now to FIG. 7, a side cutaway view of support chuck 28 is depicted with substrate 26 disposed on substrate support region 32 and secured by clamp 74. Edge thermal zone 90 is shown in greater detail as including a side wall channel 108 for controlling the thermal energy level of indented region 36 and top wall channel 110 for controlling the thermal energy level proximate to clamp 74. The backside gas channel 112 is formed between substrate 26 and support region 32 to allow flow of backside gas from groove 100 through backside channel 112 to gas return line 106. Backside gas is isolated within substrate support chuck 28 by backside isolation seals 114 associated with clamp 74 and support region 32. Groove 100 provides a conduit for backside gas flow, acts to relieve stress associated with thermal expansion and contraction of support chuck 28, and provides thermal isolation between middle thermal zone 88 and edge thermal zone 90.

Referring now to FIG. 7A, a top view of support region 32 is depicted as having inner thermal zone 86, middle thermal zone 88, and edge thermal zone 90. Temperature measurement instruments 116, such as thermocouples or fiber-optic pyrometers, are associated with each thermal zone to provide precise measurement of the respective thermal zones' thermal energy level. Uniform temperature control of a substrate disposed across support region 32 is achieved with a multi-zone heater, the heater having independent control of the thermal energy level of inner thermal zone 86 and middle thermal zone 88. Inner thermal zone 86 and middle thermal zone 88 are arranged in a concentric manner, with the associated temperature measurement instrument 116 of each thermal zone providing independent temperature measurements for the respective thermal zone. Independent thermal zone control can be provided by a controller., such as a personal computer, that accepts thermal measurements from temperature measurement instruments 116 and adjusts the energy provided by the heater to each thermal zone to achieve predetermined temperature conditions. The controller can also maintain predetermined temperature condition along edge thermal zone 90 by controlling the thermal energy provided by a perimeter heater associated with edge thermal zone 90. The perimeter heater compensates for conductive heat loss from the edge of support region 32 and allows localized temperature control of the edge of the substrate wafer.

Support chuck 28 advantageously promotes deposition of a uniform thin film on substrate 26 by allowing precise thermal control across the surface of substrate 26. Further, support chuck 28 reduces undesired deposition or condensation of material on the clamp, and the side of the chuck, by controlling the thermal energy level along areas where deposition should be limited. The chuck also decreases maintenance by providing a design that allows simple disassembly for replacement of chuck components. For instance, by removing support region 32 of chuck 28, heater 84 can easily be repaired or replaced. Such maintenance work presents a reduced risk of inadvertent contamination of reaction chamber 12 and substrates being processed because chuck 28 reduces undesired deposition of material along its surface. Thus, maintenance will not cause contaminants to break free from chuck 28.

Figure 8:
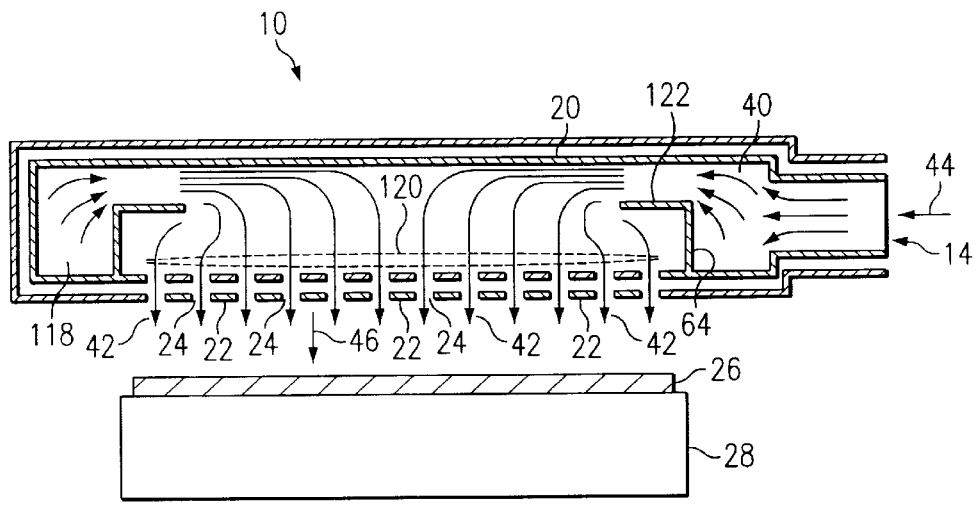
FIG. 8 depicts a side cutaway view of a CVD showerhead assembly having a process gas inlet and associated baffle for redirecting a process gas flow.

Referring now to FIG. 8, a side cutaway view of a showerhead assembly 10 is depicted for providing a uniform process gas flow to a substrate 26. Housing 20 has double-walls to accept thermally controlled fluids for maintaining the temperature of process gas within housing 20. Housing 20 has a gas feed opening 14 located along a side wall. Process gas flows into gas feed opening 14 along intake vector 44 that is substantially parallel to the surface of substrate 26. Incoming gas flow 40 enters a process gas channel 118 that is defined by the interior wall of housing 20 and a baffle 64 disposed between the interior wall and the gas dispersion plate openings 24. In the previous example of a circular-shaped housing 20, baffle 64 forms an annular ring within housing 20. Thus, process gas channel 118 defined by baffle 64 and interior walls of housing 20 form an annular channel.

Incoming gas flow 40 is deflected by baffle 64 to allow gas flow 40 to fill process gas channel 118 along the peripheral of housing 20. As process gas channel 118 fills with gas flow 40, gas flow 40 overflows into the interior portion 120 of housing 20. A top baffle plate 122 coupled to baffle 64 and extending horizontally from baffle 64 into interior portion 120 of housing 20, helps enable gas flow 40 to evenly fill interior portion 120. As interior portion 120 fills with process gas, an outgoing gas flow is provided through gas dispersion plate openings 24 along an outflow vector 46 that is substantially perpendicular to the surface of substrate 26.

In operation, showerhead assembly 10 depicted by FIG. 8 supports a side process gas feed by redirecting incoming gas flow from an intake vector needed for side gas feed to an outflow vector needed to obtain uniform gas flow for deposition of a uniform material film. Baffle 64 redirects intake vector 44 by blocking incoming gas flow 40 along intake vector 44 and redirecting gas flow 44 to fill process gas channel 118. To accomplish redirection of gas flow 40, baffle 64 presents an impediment along intake vector 44 that is substantially perpendicular to.intake vector 44. In various embodiments, the height and angular disposition of baffle 64 can vary to provide precise control for the redirection of incoming gas flow 40 from intake vector 44 to outflow vector 46. Further, baffle 64 can use a top baffle plate 122, having various lengths and angular dispositions, to control the manner in which interior region 120 of housing 20 fills with process gas. In alternative embodiments, baffle 64 can alter the shape of process channel 118 about the periphery of housing 20 to optimize process gas flow. Baffle 64 can be removably coupled to the base of housing 20 to support replacement of baffle 64 with baffles having different configurations. Similarly, top baffle plate 122 can be removably coupled to baffle 64 to allow replacement with top baffle plates having different configurations. To support maintenance and the replacement of baffles 64 within housing 20, the upper surface of housing 20 can be removably coupled. Thus, maintenance personnel can easily access the interior of housing 20 as needed.

Figure 9:
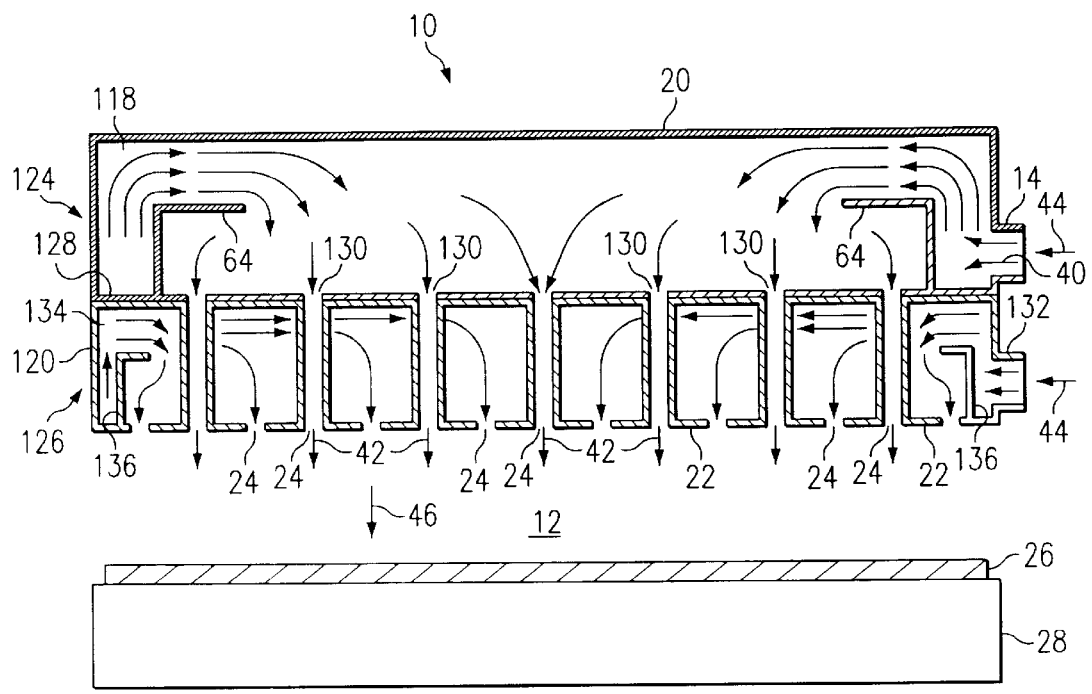
FIG. 9 depicts a side cutaway view of a CVD showerhead assembly for supporting CVD with plural process gases.

Referring now to FIG. 9, a side cutaway view of showerhead assembly 10 is depicted in a configuration that supports the side feed of plural process gases. Housing 20 is divided into a first plenum 124 and a second plenum 126 by an interior gas dispersion plate 128. First plenum 124 accepts process gas through first gas feed opening 14 along first intake vector 44. First incoming gas flow 40 interacts with first baffle 64 and first process gas channel 118 to disperse process gas within first plenum 124. The process gas flows from first plenum 124 through passageways 130 and out gas dispersion plate openings 24 along outflow vector 46. A second process gas flows into second plenum 126 through a second gas feed opening 132 along intake vector 44. The second process gas flows into a second process gas channel 134 formed by a second baffle 136 and then flows into second plenum 126. The second process gas fills second plenum 126 and flows out gas dispersion plate openings 24 along outflow vector 46. In this way, the first and second process gases are kept separate until exiting gas dispersion plate openings 24 at reaction chamber 12.

By feeding both the first and second process gases through the side of housing 20, the showerhead assembly 10 of FIG. 9 enables a modular assembly with a minimal vertical footprint. The upper surface of housing 20 can be removed to allow maintenance within first plenum 124. Alternatively, first plenum 124 can be removably coupled to second plenum 126 to support assembly and disassembly of the housing, thus enabling simplified maintenance within second plenum 126. The modular assembly reduces the complexity of showerhead assembly 10 for mixing plural process gases. The simplified modular construction reduces back flow pressure, enabling improved dispersion of marginally stable process gases, such as the process gases needed to deposit copper.

Figure 10:
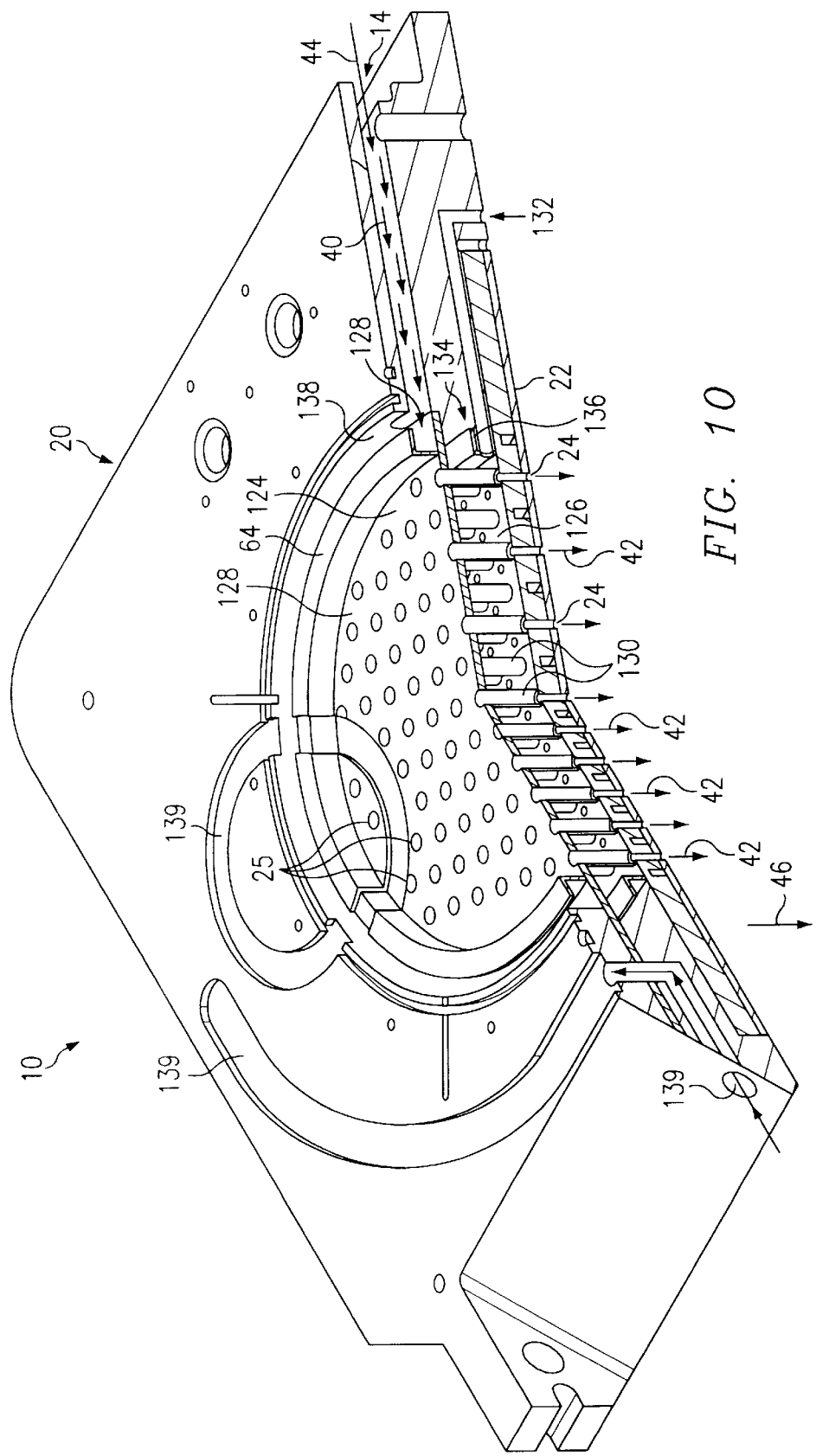
FIG. 10 depicts a side three dimensional cutaway view of one embodiment of a showerhead assembly that supports CVD with plural process gases.

Referring now to FIG. 10, a side cutaway three-dimensional view of a dual-plenum showerhead assembly 10 is depicted. Baffle 64 disposed within first plenum 124 and baffle 136 disposed within second plenum 126 are annular rings located along the periphery of housing side wall 138. Passageways 130 lead from gas dispersion plate openings 24 of first plenum gas dispersion plate 128 through second plenum 126 and gas dispersion plate openings 24 of gas dispersion plate 22 to flow as first outgoing gas flow 42 along outflow vector 46. The passageways can be welded, milled or screwed into place. Opening 14 associated with first plenum 124 is integrated within housing 20, thus reducing the risk of contaminants breaking free as can happen when flexible hoses are used to feed process gas. Coolant channels 139 provide thermally controlled fluids through housing 20 to maintain process gas temperatures at predetermined levels that prevent inadvertent deposition in housing 20. The coolant channels can extend through the first and second plenums to enchance process gas temperature control.

Figure 11A:
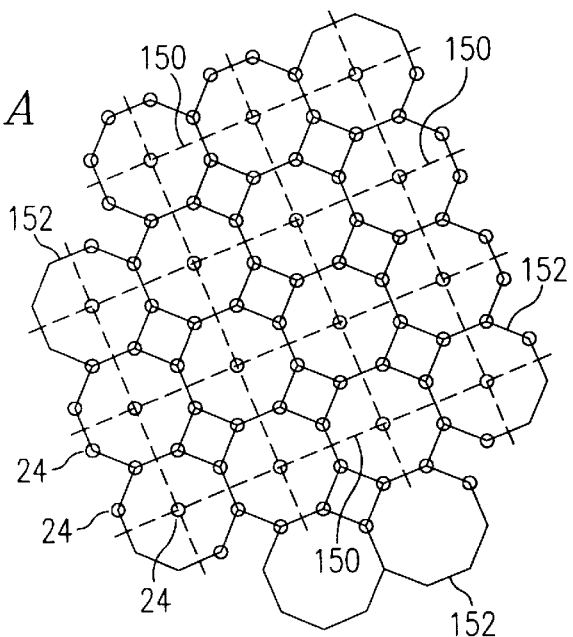
FIGS. 11A, 11B, and 11C depict various configurations of the openings of the gas dispersion plate for supporting the dispensing of plural process gases from the showerhead to the process reaction chamber.
Figure 11B:
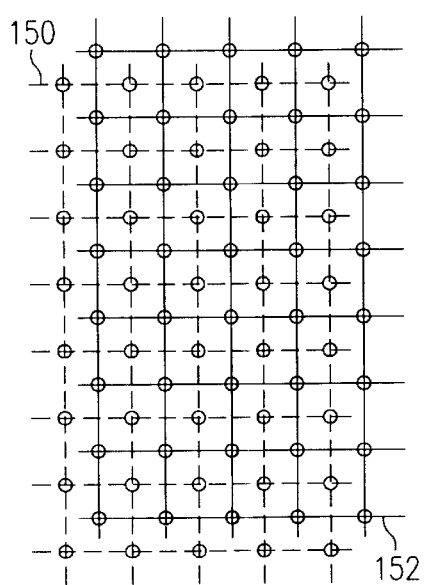
Figure 11C:
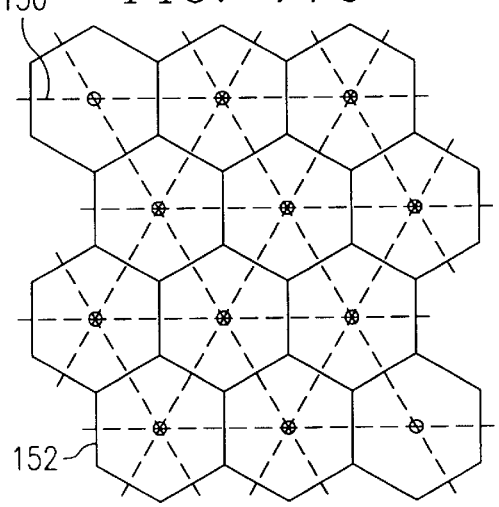

Referring now to FIGS. 11A, 11B, and 11C, different embodiments of gas dispersion plate openings 24 associated with gas dispersion plate 22 are depicted. FIG. 11A depicts a first set of dispersion plate openings 24 connected by dotted lines 150 to form plural square geometric shapes. A second set of dispersion plate openings 24 are interconnected by solid lines 152 to form octagon geometric shapes. FIG. 11B depicts plural offset square geometric shapes associated with dotted lines 150 and solid lines 152. FIG. 11C depicts plural hexagon geometric shapes associated with solid lines 152 and plural triangular geometric shapes associated with dotted lines 150. The various geometric shapes depicted by FIGS. 11A, 11B, and 11C provide predetermined gas dispersion from dispersion plate openings 24 to enhance control of process gas flow and mixing for plural process gases. The arrangement of gas dispersion plate openings 24 into various geometric shapes avoids the ring-shaped deposition of a material film associated with conventional concentric gas dispersion plate opening configurations.

Gas dispersion plate openings 24 associated with dotted lines 150 dispense process gas from first plenum 124 and passageways 130. Gas dispersion plate openings 24 associated with solid lines 152 dispense process gas from second plenum 126. The selection of a combination of one or more geometric shapes can be made for predetermined mixing of plural process gases to optimize film deposition. By associating geometric shapes having fewer openings, such as the square shape of FIG. 11 and the triangular shape of FIG. 1C, with the first plenum 124, the number of passageways 130 needed from first plenum 124 through second plenum 126 is reduced, resulting in reduced complexity of the system. In addition to varying the combinations of geometric shapes for the respective process gases, other deposition parameters can be varied to optimize the deposition of a uniform thin film. For instance, varying process gas pressure levels and temperature conditions can be used to optimize process gas flow to substrate 26.

Figure 12C:
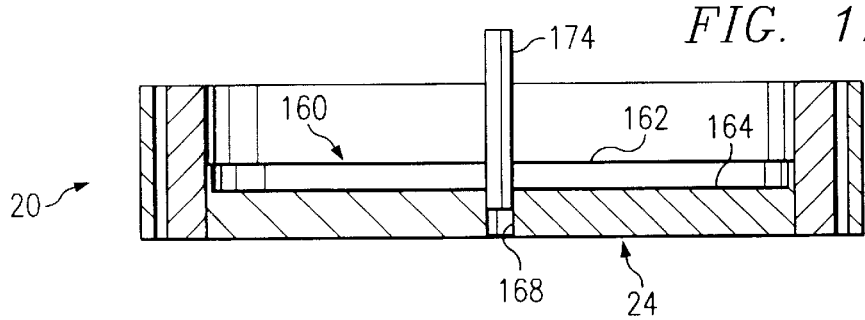
FIG. 12C depicts a side cutaway view of a flow adjusting mechanism supported by a central shaft.
Figure 12A:
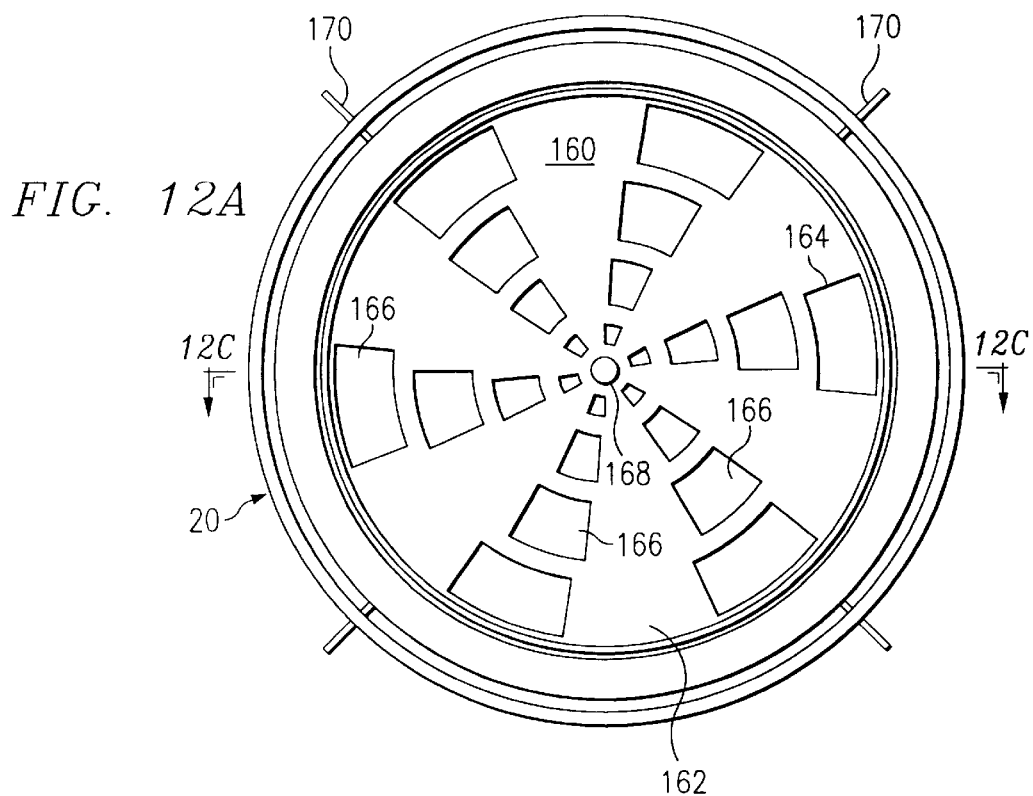
FIG. 12A depicts a top view of a flow adjusting mechanism in a closed position.
Figure 12B:
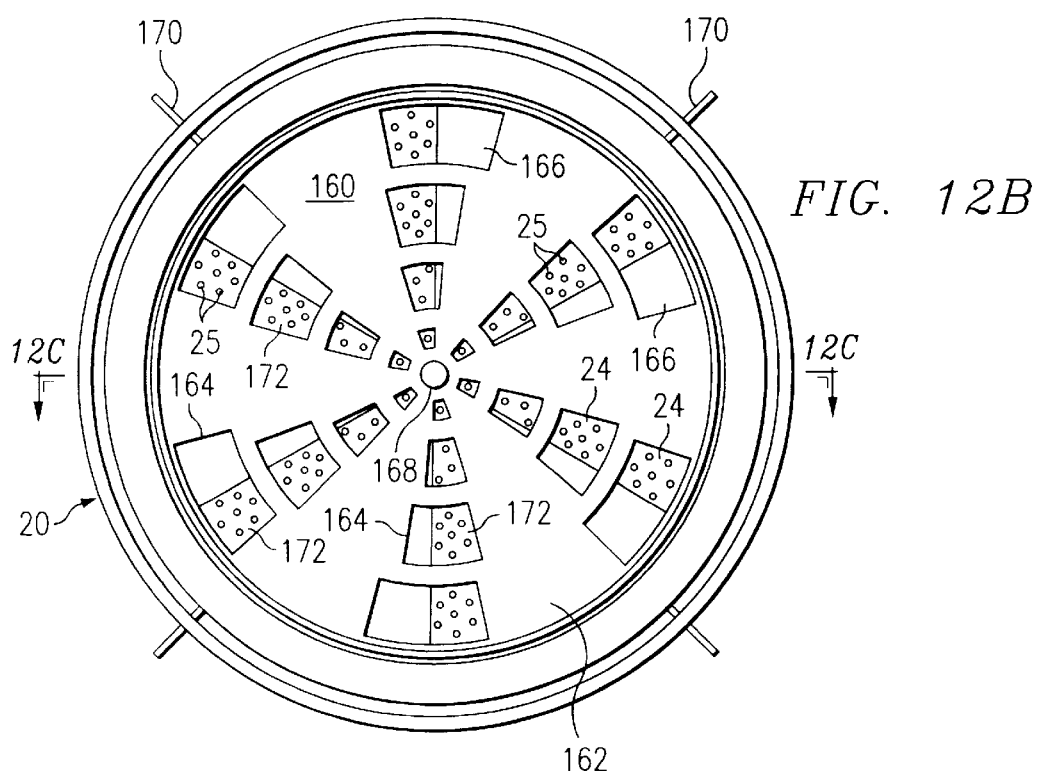
FIG. 12B depicts a top view of a flow adjusting mechanism in a partially open position.

Referring now to FIGS. 12A, 12B and 12C, a flow adjusting mechanism 160 is depicted for providing additional process gas flow control from housing 20 to reaction chamber 12. Flow adjusting mechanism 160 includes a first flow adjusting plate 162 coupled in a rotational sliding relationship with a second flow adjusting plate 164. First flow adjusting plate 162 has openings 166 to allow process gas flow through first flow adjusting plate 162. As depicted by FIG. 12A, second flow adjusting plate 164 rotates to impede process gas flow through opening 166. An adjustment arm 170 couples to either the first or second flow adjusting plate to allow rotation of the plates relative to each other about central rotation point 168 and central shaft 174. Alternatively, a motor can rotate plates 162 and 164 by rotating shaft 174. Adjustment arm 170 can be manually moved, automatically moved with a motor, such as a stepper motor, or can be moved through housing 20 by a magnetic relationship, such as a magnet associated with adjustment arm 170 and a magnet disposed outside of housing 20.

Referring now to FIG. 12B, flow adjusting mechanism 160 is depicted in a partially open position for allowing process gas flow from housing 20 to gas dispersion plate 24 and out gas dispersion plate openings 25. First flow adjusting plate 162 and second flow adjusting plate 164 are rotationally aligned so that opening 166 of first flow adjusting plate 162 aligns with opening 172 of second flow adjusting plate 164. By adjusting the relative rotational positions of first flow adjusting plate 162 and second flow adjusting plate 164, the process gas flow from housing 20 through opening 166 and opening 172 can be adjusted. This enhances the control of process gas flow provided to substrate 26. For instance, flow adjusting mechanism 160 can be positioned to impede process gas flow to allow housing 20 to fill with process gas, and can then be opened to initiate a uniform gas flow.

Although the present invention has been described in detail, it should be understood that there are changes, substitutions, and alterations can be made hereto without departing from the spirit and scope of the invention as defined by the appended claims.

What is claimed is:

1. An apparatus for dispensing gas for fabrication of a device on a substrate, the apparatus comprising:
    a housing having a top end, a bottom end and a side wall, the side wall having a process gas feed opening for accepting process gas flow having an intake vector;
    a gas dispersion plate associated with one of the housing ends, the gas dispersion plate having plural openings for dispensing the process gas flow to the substrate along an outflow vector;
    a baffle disposed in the housing proximate the housing side wall, the baffle generally perpendicular to the intake vector; and
    a plate coupled to the baffle, the plate extending from the baffle generally parallel to the intake vector, the baffle and the plate cooperating with the process gas flow to redirect the process gas flow from the intake vector to the outflow vector.

2. The apparatus of claim 1 wherein the housing comprises a first plenum associated with the side wall process gas feed opening and the baffle, the first plenum cooperating with predetermined gas dispersion plate openings for dispensing the process gas, the housing further comprising a second plenum associated with a second gas feed opening for accepting a second process gas flow, the second plenum cooperating with predetermined gas dispersion openings via passageways for dispensing the second process gas to the substrate.

3. The apparatus of claim 2 wherein the gas dispersion plate openings associated with the first and second plenums form first and second geometric patterns.

4. The apparatus of claim 2 wherein the gas dispersion plate openings associated with the first plenum form plural first geometric shapes, and wherein the gas dispersion plate openings associated with the second plenum form plural second geometric shapes.

5. The apparatus of claim 2 further comprising temperature-control channels disposed within the first and second plenums for maintaining the plenums at a predetermined temperature.

6. The apparatus of claim 1 wherein the housing side wall has a circular shape having a circumference, and wherein the baffle comprises a ring-shaped wall coupled to the gas dispersion plate to form a process gas channel.

7. The apparatus of claim 1 wherein the housing has an evacuation opening for evacuation of process gas from within the housing.

8. The apparatus of claim 1 further comprising a flow-adjusting plate associated with the gas dispersion plate to adjust the process gas flow from the dispersion plate openings.

9. The apparatus of claim 8 further comprising an adjusting arm coupled to the flow-adjusting plate to manually adjust the process gas flow.

10. The apparatus of claim 8 further comprising a stepper motor coupled to the flow-adjusting plate to automatically adjust the process gas flow.

11. The apparatus of claim 8 wherein the flow-adjusting plate rotates about a central axis of the gas dispersion plate.

12. The apparatus of claim 1 further comprising a temperature-control channel disposed within the housing for maintaining the housing at a predetermined temperature.

13. The apparatus of claim 1 further comprising a temperature-control channel disposed within the gas dispersion plate for maintaining the gas dispersion plate at a predetermined temperature.

14. A gas dispensing apparatus for dispensing gas during fabrication of a device on a substrate, the apparatus comprising:
    a housing having a top end, a bottom end and a side wall, the side wall having plural openings for receiving process gas flows along an intake vector;
    plural baffles disposed in the housing, a baffle interceding with each process gas flow to re-direct each process gas flow to an outflow vector, each baffle generally perpendicular to the intake vector and including a plate coupled to each baffle, the plate extending from the baffle generally perpendicular to the outflow vector;
    a gas dispersion plate having a plurality of openings for dispensing gas along the outflow vector; and
    wherein the housing further includes a plenum associated with each process gas flow, each plenum cooperating with predetermined gas dispersion openings for dispensing the process gas flows to the substrate.

15. The apparatus of claim 14, wherein the baffle comprises a wall proximate the housing side wall and generally perpendicular to the intake vector.

16. The apparatus of claim 14, wherein the housing side wall has a circular shape having a circumference, and wherein the baffle comprises a ring-shaped wall coupled to the gas dispersion plate to form a process gas channel.

17. The apparatus of claim 14, wherein the housing has an evacuation opening for evacuation of process gas from within the housing.

18. The apparatus of claim 14, wherein the gas dispersion plate openings associated with the first plenum form plural first geometric shapes, and wherein the gas dispersion plate openings associated with the second plenum form plural second geometric shapes.

19. The apparatus of claim 14, further comprising a flow-adjusting plate associated with the gas dispersion plate to adjust the process gas flow from the dispersion plate openings.

20. The apparatus of claim 19, further comprising an adjusting arm coupled to the flow-adjusting plate to manually adjust the process gas flow.

21. The apparatus of claim 19, further comprising a stepper motor coupled to the flow-adjusting plate to automatically adjust the process gas flow.

22. The apparatus of claim 19, wherein the flow-adjusting plate is configured to rotate about a central axis of the gas dispersion plate.

23. The apparatus of claim 14, further comprising temperature-control channels disposed within the first and second plenums for maintaining the plenums at predetermined temperatures.

* * * * *